United States Patent
Tang et al.

[11] Patent Number: 5,545,305
[45] Date of Patent: Aug. 13, 1996

[54] METHOD FOR THE ELECTROCHEMICAL DEPOSITION OF $REBA_2CU_3O_{7-x}$ SUPERCONDUCTORS

[75] Inventors: Horng-Yi Tang, Feng-Yuan; Maw-Kuen Wu, Hsinchu; Chuen-Sheng Lee, Kaohsiung; Huei-Ying Hsu, Pingtung Hsien, all of Taiwan

[73] Assignee: National Science Council, Taipei, Taiwan

[21] Appl. No.: 434,652

[22] Filed: May 4, 1995

[51] Int. Cl.[6] ............ C25D 7/00; C25D 3/66; C25D 9/00; C25D 11/00
[52] U.S. Cl. ............ 205/51; 205/230; 205/333; 205/357; 205/362
[58] Field of Search ............ 205/51, 230, 333; 204/61; 505/472

[56]  References Cited

U.S. PATENT DOCUMENTS 5,256,260  10/1993  Norton et al. ............ 204/61

*Primary Examiner*—Kathryn Gorgos
*Assistant Examiner*—Edna Wong
*Attorney, Agent, or Firm*—Fish & Richardson, P.C.

[57]  ABSTRACT

Crystalline $REBa_2Cu_3O_{7-x}$ superconductors are obtained by a constant-potential or current density electrochemical deposition in an alkaline hydroxide molten flux in a three-electrode, single-compartment cell operating at a temperature below 500° C.

24 Claims, 3 Drawing Sheets

METHOD FOR THE ELECTROCHEMICAL DEPOSITION OF $REBA_2CU_3O_{7-x}$ SUPERCONDUCTORS

FIELD OF THE INVENTION

The present invention relates to a method for the electrochemical deposition of $REBa_2Cu_3O_{7-x}$ superconductors, and in particular to a method for the low temperature electrochemical deposition of $REBa_2Cu_3O_{7-x}$ superconductors in an alkaline hydroxide molten flux.

BACKGROUND OF THE INVENTION

The ability to achieve superconductivity using liquid nitrogen cooling in copper oxide superconductors has excited scientists trying to develop these ceramics into useful form. Although great efforts have been expended in the last few years, unfortunately, owing to chemical and thermal instabilities of these copper oxides, materials of the required quality have not yet been achieved. It has been apparent that other approaches to the synthesis of these materials must consider their instabilities. The instabilities include phase stability, oxide volatility and the instability of the copper oxidation state at high temperature.

Significant progress has been made toward solution of the instabilities by using alkaline hydroxide as a low temperature flux. For example, in U.S. Pat. No. 5, 256, 260 issued to Michael L. Norton and the co-inventor of this application, Horng-Yi Tang, there is disclosed an electrodeposition method which can synthesize crystalline Ba—K—Bi—O layers on anode with 32K as-grown superconductivity under isothermal, constant potential conditions using a three-electrode, one-compartment cell geometry operating at a temperature of 260° C. However, the poorly defined phase diagram and complexity of flux-complex ions interactions limit this low temperature method in binary and a few ternary oxides systems which can not have transition temperature higher than the liquid nitrogen region.

SUMMARY OF THE INVENTION

It is therefore an object of the invention to devise a novel low-temperature electrochemical deposition method to synthesize cuprate-based superconductor crystals, in particular $REBa_2Cu_3O_{7-x}$ crystals with liquid nitrogen cooling as-grown superconductivity.

It has been found that the most important feature in the preparation of superconducting $REBa_2Cu_3O_{7-x}$ crystals is the intrinsic necessity of oxygen or oxidizing agent transport to the growing crystal/solution interface. According to the method of the invention, the oxidative power in low temperature electrocrystallization system is attained by controlling the oxidation potential of working electrode.

Specifically, the electrochemical deposition method of the invention includes providing a melt solution of a copper-based component, a barium-based component, a rare earth element-based component and an alkaline hydroxide; maintaining the melt solution at a temperature below 500° C.; and performing electrodeposition in a cell which is equipped with an anode, a cathode and a reference electrode while maintaining a substantially constant potential or constant current density at the anode with reference to the reference electrode.

BRIEF DESCRIPTION OF THE DRAWINGS

The present invention can be more fully understood by reference to the following detailed description and accompanying drawings, in which.

DETAILED DESCRIPTION OF THE INVENTION

The electrochemical deposition method of the invention is characterized in that the electrochemical deposition process is conducted at a low temperature, i.e. below 500° C., preferably between 180° C. and 500° C., and most preferably between 300° C. and 400° C., and the potential or current density at the anode is maintained at a substantially constant value. This technique is capable of providing $REBa_2Cu_3O_{7-x}$ crystals with liquid nitrogen cooling as-grown superconductivity on planar or irregular surface such as metal wires, tapes etc.

According to the method of the invention, the alkaline hydroxide includes hydroxides of lithium, sodium, potassium, rubidium and cesium. Preferred examples are potassium hydroxide, sodium hydroxide or the mixture thereof. The copper-based component includes copper metal, copper oxide or copper hydroxide. The barium-based component includes barium oxide and barium hydroxide. The rare earth element-based component includes oxide and hydroxide of rare earth elements, such as Y, Eu, Nd, Sm and Pr. The above components are loaded in a three-electrode, one-compartment cell whose structure will be described in detail hereunder, melted and subjected to electrodeposition. Note that the above components should be provided in such a way that the atomic ratio of rare earth element to copper is not less than 0.1, preferably between 0.5 and 50, and the atomic ratio of barium to copper is not less than 0.2, preferably between 1 and 100. Also, it is essential that the weight ratio of the total electrolyte, i.e., the copper-based component, barium-based component and the rare earth element-based component, to the flux, i.e., the alkaline hydroxide, should equal to or be less than 1.

Figure 1:
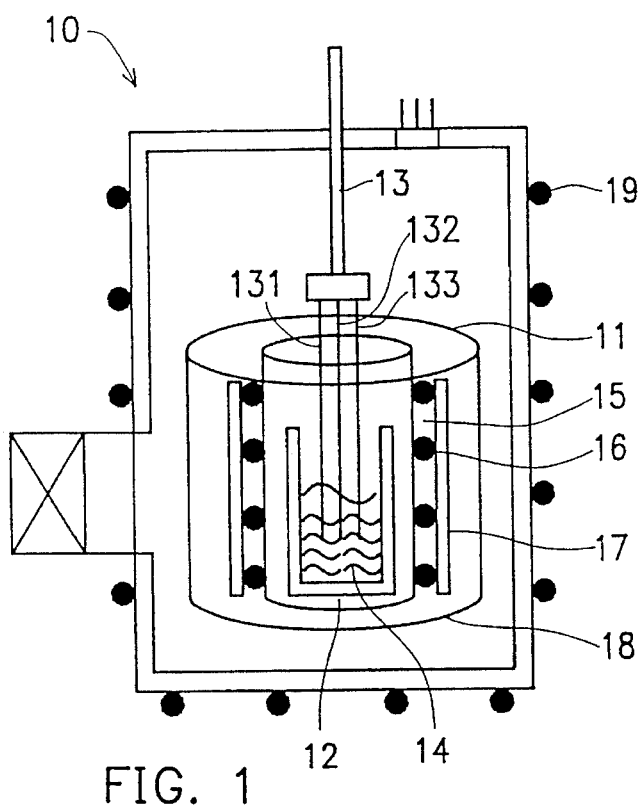
FIG. 1 is a schematic diagram showing an embodiment of the electrochemical crystal growth system used in the method of the invention.

The method of electrodeposition of $REBa_2Cu_3O_{7-x}$ crystals is performed in a three-electrode, one-compartment cell. A preferred embodiment of this cell 10 is shown in FIG. 1. Reactor 11 contains a platinum crucible 12. Three electrodes, cathode 131, anode 132 and reference electrode 133, are suspended within the melt 14 by an electrode support 13. Note that the reference electrode 133 is placed somewhat closer to the anode 132 than to the cathode 131. The preferred materials for the three electrodes is platinum or silver, although other materials can be used. A 1 mm diameter platinum wire electrode is used in this embodiment for the three electrodes. The entire platinum crucible 12 including the melt 14 and three electrodes 131, 132, 133 is contained in cell body 10 which maintain an inert atmosphere over the melt 14 by evacuating and then backfilling with inert gas. Maintenance of an inert atmosphere is necessary according to the invention in order to avoid oxidation of the chemical system. This oxidation can be quite rapid at elevated temperatures. Heating element 16 is supported by and provided surrounding the quartz tube 15 for melting these components loaded in the crucible 12, and is insulated by quartz insulation 17. The entire reactor 11 is contained in the cell body 10 which is cooled by cooling means 19 to avoid overheating, and is packed with graphite felt 18 inside so that quartz tube 15 can be maintained in an isothermal condition.

According to a typical electrochemical deposition of the invention, the alkaline hydroxides, in the form of pellets, are loaded in the crucible 12 and melted. After a transparent melt is obtained, the other components, the electrolytes, are added with stirring to aid dissolution. Upon attaining the operating temperature, the stirring is stopped, electrolysis is then initiated. The electrolysis is performed at a substantially constant potential or constant current density. If the electrolysis is to be performed at a constant potential, an applied potential typically 0.05 V to 1 V, preferably 0.15 V to 0.6 V versus reference electrode is employed. The constant potential can be obtained by using a potentiostat, for example, a EG&G 273A high-current potentiostat. When the electrolysis is to be performed at a constant current density, a current density between 1 $\mu A/cm^2$ and 10 $mA/cm^2$, preferably between 10 $\mu A/cm^2$ and 2 $mA/cm^2$ is employed. The constant current density can be obtained by using a EG&G 273A. Deposition on anode begins immediately and is terminated when the crystal deposited anode is withdrawn.

The examples which follow illustrate the method of the invention without implying any limitation.

EXAMPLE 1

Figure 3:
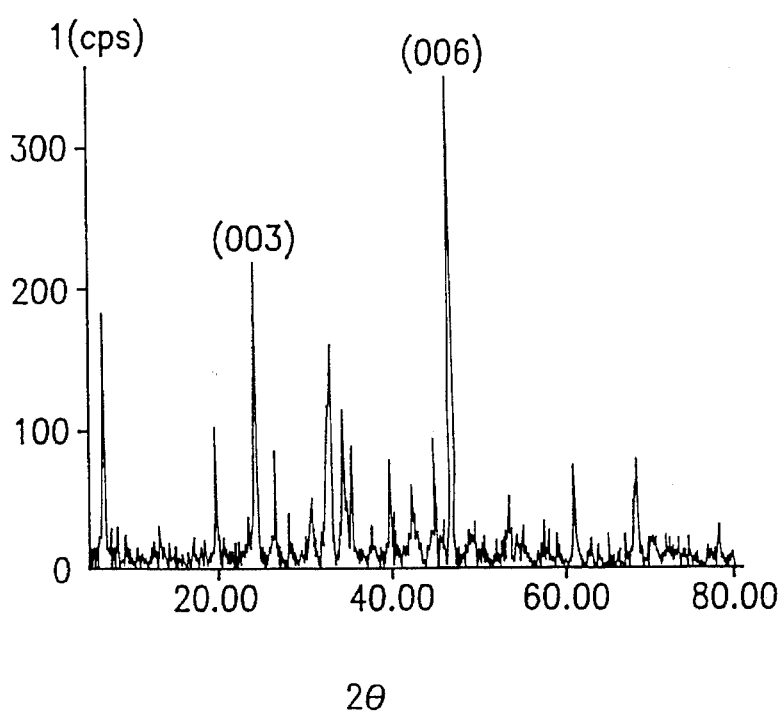
FIG. 3 is a diagram showing the X ray powder diffraction pattern of $EuBa_2Cu_3O_{7-x}$ crystallites according to Example 1.
Figure 2:
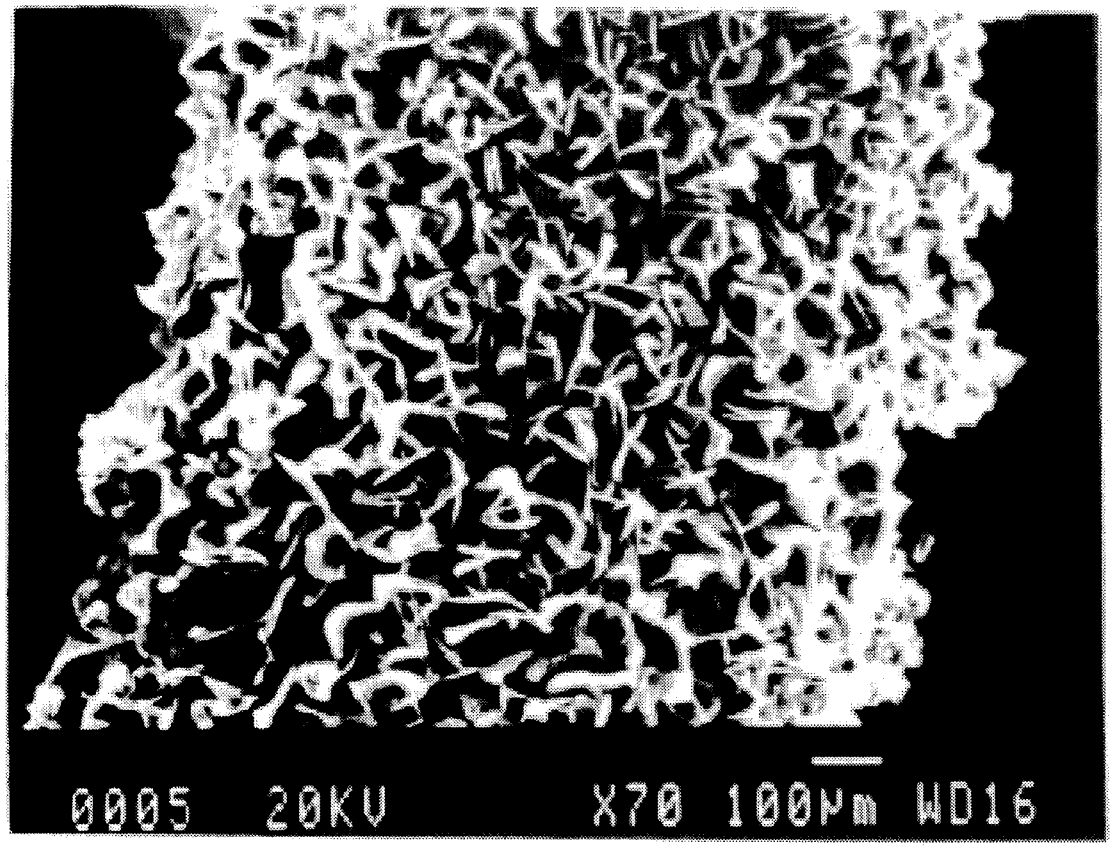
FIG. 2 is a scanning electron microphotograph of the $EuBa_2Cu_3O_{7-x}$ crystallites deposited on a working electrode according to Example 1.
Figure 4:
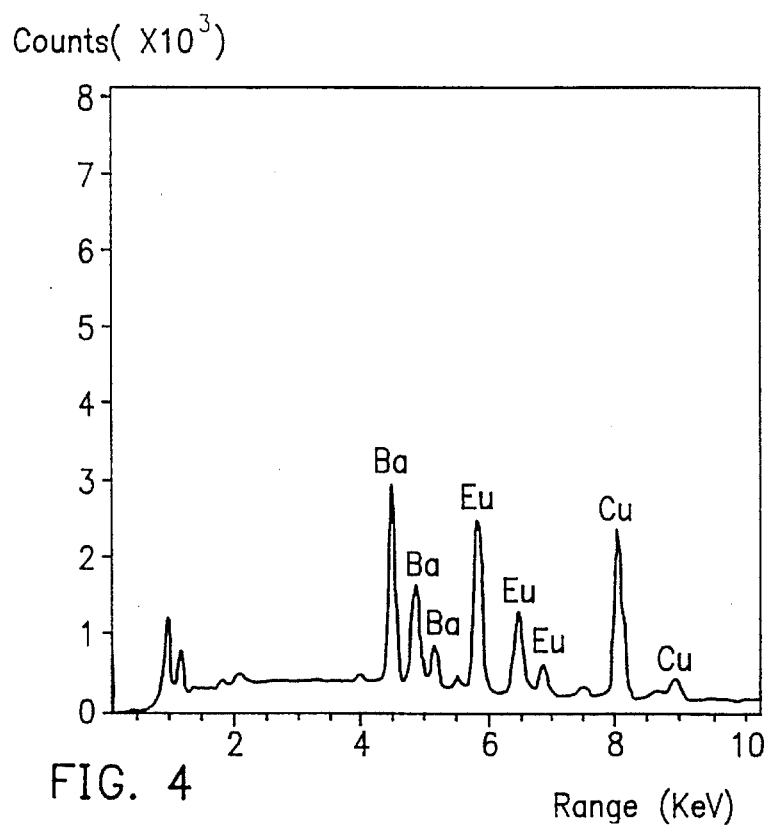
FIG. 4 is a diagram showing the typical spectrum of $EuBa_2Cu_3O_{7-x}$ crystallites.
Figure 5:
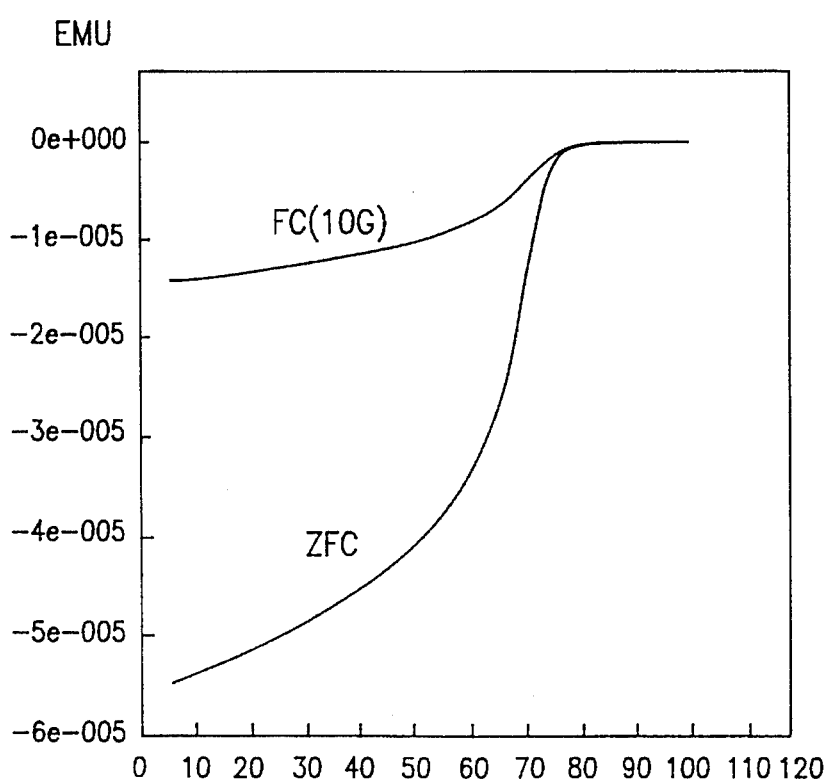
FIG. 5 is a diagram showing the typical SQVID (Superconducting Quantum Interference Device) data of the as-grown crystals with an onset of temperature at 77° K.

80 grams of reagent grade KOH, 0.1 m $Eu_2O_3$, 0.2 m $Ba(OH)_2$ and 0.3 m $Cu(OH)_2$ were mixed intimately in the crucible as depicted in FIG. 1 and described above. The temperature of the reactor was then raised to 260° C. and was subjected to electrodeposition under $N_2$ atmosphere at a constant potential of 0.2 volts versus platinum wire electrode for one hour. Highly faceted black crystals were rapidly formed on the anode. The current efficiency was about 35%. Microphological examination and photomicrographs of representative crystallites were taken by using a Jeol JSM-840A scanning electron microscope. The result is shown in FIG. 2. As shown in FIG. 2, the crystal growth direction is along the ab plane. The average crystal size is approximately 100 µm. X-ray diffraction studies were also made by using a MAC MXP3 X-ray diffraction system, and the results are shown in FIG. 3. As is apparent from FIG. 3, the sample contains $EuBa_2Cu_3O_{7-x}$ phase. A representative energy dispersive X-ray (EDX) study was also made, and the spectrum is displayed in FIG. 4. An average of the analysis on several crystals, yields a composition in atom percentage of the crystals of Eu: 17±2%, Ba:28±2% and Cu:55±2%. Note that because of high absorbency of the Ba and alkali metal X-ray emission lines, the accuracy of the stoichiometry of these elements may not be well represented by the precision of the measurements indicated above. The typical SQVID (Superconducting Quantum Interference Device) data of the as-grown crystals was obtained and is depicted in FIG. 5. As shown in FIG. 5, the as-grown crystals have an onset temperature at 77° K.

EXAMPLE 2

Except that the reaction temperature was 460° C. and the potential was set at 0.16 V, the procedures as set forth in Example 1 were repeated. Highly faceted black $EuBa_2Cu_3O_{7-x}$ crystals were also rapidly formed on the anode.

EXAMPLE 3

Except that the current density was set at 1 $mA/cm^2$, instead of the potential, the procedures as set forth in Example 1 were repeated. Highly faceted black $EuBa_2Cu_3O_{7-x}$ crystals were also rapidly formed on the anode.

EXAMPLE 4

600 grams of reagent grade NaOH, 0.1 m $Eu_2O_3$, 0.2 m $Ba(OH)_2$ and 0.3 m $Cu(OH)_2$ were mixed intimately in the crucible as depicted in FIG. 1 and described above. The temperature of the reactor was then raised to 380° C., and moistened inert gas was introduced in the reactor to maintain the water partial pressure therein. Electrodeposition under $N_2$ atmosphere at a constant potential of 0.2 volts versus platinum wire electrode for 2 hours yielded highly faceted black crystals on the anode. The current efficiency was 25%.

Example 5

Except that the reaction temperature was 460° C. and the potential was set at 0.16 V, the procedures as set forth in Example 4 were repeated. Highly faceted black $EuBa_2Cu_3O_{7-x}$ crystals were also rapidly formed on the anode.

EXAMPLE 6

Except that the current density was set at 1 $mA/cm^2$, instead of the potential, the procedures as set forth in Example 4 were repeated. Highly faceted black $EuBa_2Cu_3O_{7-x}$ crystals were also rapidly formed on the anode.

The invention has the advantage of control of product stoichiometry through electrochemical control. Also, the ability to form a large $EuBa_2Cu_3O_{7-x}$ superconductor coating on planner or irregular surfaces such as metal wires, tape etc., without post annealing treatment gives this low temperature electrochemical deposition method considerable practical potential.

What is claimed is:

1. A method for the electrochemical deposition of $REBa_2Cu_3O_{7-x}$ superconductors, wherein RE is a rare earth element, said method using molten salt electrocrystallization and comprising the following steps:

(a) providing a melt solution comprising a copper-based component, a barium-based component, a rare earth element-based component, and an alkaline hydroxide;

(b) maintaining said melt solution at a temperature which sustains said melt solution in a molten state below about 500° C.;

(c) providing an anode and a cathode and a reference electrode and suspending said anode, said cathode, and said reference electrode within said melt solution; and (d) electrodepositing a $REBa_2Cu_3O_{7-x}$ superconductor onto said anode while maintaining a substantially constant potential or constant current density at the anode with reference to said reference electrode.

2. The method as claimed in claim 1, wherein said reference electrode is provided in close proximity to said anode.

3. The method as claimed in claim 1, wherein said electrodeposition is performed under isothermal conditions.

4. The method as claimed in claim 3, wherein said electrodeposition is performed at a temperature of between 180° C. and 500° C.

5. The method as claimed in claim 4, wherein said electrodeposition is performed at a temperature of between 300° C. and 400° C.

6. The method as claimed in claim 1, wherein said melt solution comprises potassium hydroxide, barium oxide, europium oxide, and copper oxide.

7. The method as claimed in claim 1, wherein said electrodeposition is maintained in an inert atmosphere.

8. The method as claimed in claim 1, wherein said constant potential is between about 0.05 V and 1 V versus said reference electrode.

9. The method as claimed in claim 8, wherein said constant potential is between 0.15 V to 0.6 V.

10. The method as claimed in claim 1, wherein said constant current density is between 1 $\mu$A/cm2 and 10 mA/cm2.

11. The method as claimed in claim 10, wherein said constant current density is between 10 $\mu$A/cm2 and 2 mA/cm2.

12. The method as claimed in claim 1, wherein said alkaline hydroxide is a hydroxide selected from the group consisting of potassium hydroxide, sodium hydroxide, and the mixture thereof.

13. The method as claimed in claim 1, wherein said copper-based component is a component selected from the group consisting of copper, copper oxide and copper hydroxide.

14. The method as claimed in claim 1, wherein said barium-based component is a component selected from the group consisting of barium oxide and barium hydroxide.

15. The method as claimed in claim 1, wherein said rare earth element-based component is an oxide of a rare earth element.

16. The method as claimed in claim 15, wherein said rare earth element is an element selected from the group consisting of Y, Eu, Nd, Sm and Pr.

17. The method as claimed in claim 1, wherein said rare earth element-based component is a hydroxide of a rare earth element.

18. The method as claimed in claim 17, wherein said rare earth element is an element selected from the group consisting of Y, Eu, Nd, Sm and Pr.

19. The method as claimed in claim 1, wherein the weight ratio of the mixture of copper-based component, barium-based component and rare earth element-based component to the alkaline hydroxide equals or is less than 1.

20. The method as claimed in claim 1, wherein the rare earth element-based component and the copper-based component are provided in an atomic ratio of rare earth element to copper of not less than 0.1.

21. The method as claimed in claim 20, wherein the rare earth element-based component and the copper-based component are provided in an atomic ratio of rare earth element to copper of between 0.5 and 50.

22. The method as claimed in claim 1, wherein the barium-based component and the copper-based component are provided in an atomic ratio of barium to copper of not less than 0.2.

23. The method as claimed in claim 22, wherein the barium-based component and the copper-based component are provided in an atomic ratio of barium to copper of between 1 and 100.

24. The method of claim 1, wherein step (a) comprises:

(a) providing a melt solution comprising a copper-based component, a barium-based component, a rare earth element-based component, and an alkaline hydroxide, wherein the atomic ratio of the rare earth element-based component to the copper-based component is greater than 0.1, the atomic ratio of the barium-based component to the copper-based component is greater than 0.2, and the weight ratio of the copper, barium, and rare earth element-based components, combined, to the alkaline hydroxide is equal to or less than 1.

* * * * *